(12) United States Patent
Maleki et al.

(10) Patent No.: US 6,928,091 B1
(45) Date of Patent: Aug. 9, 2005

(54) OPTO-ELECTRONIC OSCILLATOR INCLUDING A TUNABLE ELECTRO-OPTIC FILTER

(75) Inventors: Lutfollah Maleki, Pasadena, CA (US); Kouros Sariri, Encino, CA (US); Vladimir S. Iltchenko, La Canada, CA (US)

(73) Assignee: OEwaves, Inc., Pasadena, CA (US)

( * ) Notice: Subject to any disclaimer, the term of this patent is extended or adjusted under 35 U.S.C. 154(b) by 160 days.

(21) Appl. No.: 10/254,608

(22) Filed: Sep. 25, 2002

Related U.S. Application Data
(60) Provisional application No. 60/325,351, filed on Sep. 26, 2001.

(51) Int. Cl.[7] .............................. H01S 3/10; H01S 3/13; G02B 26/00; G02F 1/00; G02F 1/03
(52) U.S. Cl. .......................... 372/20; 372/9; 372/29.02; 372/32; 359/237; 359/239; 359/245; 359/247
(58) Field of Search ......................... 372/9, 20, 29.02, 372/32; 359/237, 239, 245, 247

(56) References Cited

U.S. PATENT DOCUMENTS

| | | | |
|---|---|---|---|
| 5,581,642 A * | 12/1996 | Deacon et al. ............... 385/15 |
| 5,723,856 A | 3/1998 | Yao et al. ............... 250/227.11 |
| 5,777,778 A * | 7/1998 | Yao ............................. 359/245 |
| 5,917,179 A | 6/1999 | Yao ....................... 250/227.11 |
| 5,926,496 A * | 7/1999 | Ho et al. ....................... 372/92 |
| 5,929,430 A | 7/1999 | Yao et al. .................... 250/205 |
| 6,009,115 A * | 12/1999 | Ho ................................ 372/92 |
| 6,138,076 A | 10/2000 | Graf et al. ..................... 702/14 |
| 6,222,964 B1 * | 4/2001 | Sadot et al. ................... 385/40 |
| 6,389,197 B1 * | 5/2002 | Iltchenko et al. ............. 385/28 |
| 6,389,203 B1 * | 5/2002 | Jordan et al. .................. 385/50 |
| 6,417,957 B1 * | 7/2002 | Yao ............................. 359/334 |
| 6,473,218 B1 | 10/2002 | Maleki et al. ............... 359/245 |
| 6,476,959 B2 | 11/2002 | Yao ............................. 359/334 |
| 6,487,233 B2 | 11/2002 | Maleki et al. ............... 372/108 |
| 6,488,861 B2 | 12/2002 | Iltchenko et al. ............. 216/24 |
| 6,490,039 B2 | 12/2002 | Maleki et al. ............... 356/436 |
| 6,535,328 B2 | 3/2003 | Yao ............................. 359/334 |
| 6,567,436 B1 | 5/2003 | Yao et al. ...................... 372/32 |
| 6,580,532 B1 | 6/2003 | Yao et al. .................... 359/111 |
| 6,594,061 B2 | 7/2003 | Huang et al. ............... 359/239 |
| 2001/0033587 A1 * | 10/2001 | Painter et al. .................. 372/6 |
| 2002/0018611 A1 | 2/2002 | Maleki et al. ................ 385/15 |
| 2003/0012504 A1 | 1/2003 | Iltchenko ...................... 385/39 |

FOREIGN PATENT DOCUMENTS

| | | | |
|---|---|---|---|
| WO | WO 98/21617 | * 5/1998 | ........... G02B/26/10 |
| WO | WO 0196936 | 12/2001 | |

OTHER PUBLICATIONS

Braginsky et al.; Quality–Factor and Nonlinear Properties of Optical Whispering–Gallery Modes; Physics Letters A, vol. 137, No. 7,8; pps. 393–397; May 29, 1989.

Collot et al.; Very High–Q Whispering–Gallery Mode Resonances Observed on Fused Silica Microspheres; Europhysics Lettesr; 23 (5); pps. 327–334; Aug. 10, 1993.

L.E. Myers, et al. "Quasi–phase–matched optical parametric oscillators in bulk periodically poled LiNbO3", Nov. 1999, J. Opt. Soc. Am. B/vol. 12, No. 11, pps. 2102–2116.

* cited by examiner

*Primary Examiner*—Don Wong
*Assistant Examiner*—Leith Al-Nazer
(74) *Attorney, Agent, or Firm*—Fish & Richardson, P.C.

(57) ABSTRACT

An opto-electronic oscillator including a modulator for outputting modulated light and a tunable filter for receiving modulated light output from the modulator.

42 Claims, 4 Drawing Sheets

OPTO-ELECTRONIC OSCILLATOR INCLUDING A TUNABLE ELECTRO-OPTIC FILTER

CROSS-REFERENCE TO RELATED APPLICATION

The present application claims priority under 35 U.S.C. § 119(e) to U.S. Provisional application Ser. No. 60/325,351, filed on Sep. 26, 2001, which is expressly incorporated by reference in its entirety as though fully set forth herein.

ORIGIN OF THE INVENTION

The systems and techniques described herein were made in the performance of work under a contract issued by DARPA, and are subject to the provisions of Public Law 96-517 (35 U.S.C. § 202) in which the Contractor has elected to retain title. The U.S. Government has a paid-up license in this invention and the right in limited circumstances to require the patent owner to license others on reasonable terms as provided for by the terms of contract number DAAD17-02-C-0085 awarded by DARPA.

FIELD OF THE INVENTION

The present invention relates to opto-electronic systems, and in particular, to an opto-electronic oscillator including a tunable electro-optic filter.

BACKGROUND OF THE INVENTION

Opto-electronic oscillators ("OEOs") are electro-optic systems that may be used to generate microwave frequency signals having high stability and low phase noise. Typically, OEOs include a single-mode laser and an electro-optic modulator coupled to at least one active feedback loop having an open-loop gain greater than one to sustain microwave frequency oscillation. The active feedback loop includes a photodetector that converts the optical signals output from the electro-optic modulator into microwave frequency electrical signals that are, in turn, used to control the modulation of light passing through the electro-optic modulator. Thus, the active feedback loop converts the laser's output photon energy into microwave signals.

Many oscillation modes can oscillate simultaneously in the OEO as long as the gain of the active feedback loop exceeds the loop's losses. The active feedback loop typically includes a radio frequency ("RF") amplifier that amplifies the electrical signal output from the photodetector. The OEO's active feedback loop also includes an RF bandpass filter that is used to select a single mode of oscillation for the OEO's. The RF bandpass filter is also used for coarse frequency tuning of the OEO's single oscillation mode. The electrical signal output from the RF bandpass filter is the OEO's output microwave signal. The electrical signal output from the RF bandpass filter is also used to control modulation of the light that propagates through the electro-optic modulator.

One challenge associated with OEOs is that the OEO's RF bandpass filter can only provide for coarse frequency tuning. Also, the RF bandpass filter does little to reduce phase noise in the output microwave signal. Furthermore, the RF bandpass filter does not provide for fast tunability of the OEO's oscillation frequency. Therefore, there is a need for an OEO that provides for fine frequency tuning with reduced phase noise and fast tunability.

SUMMARY OF THE INVENTION

An opto-electronic oscillator that embodies the invention includes a modulator for outputting modulated light and a tunable filter for receiving modulated light from the modulator.

A tunable filter includes an optical resonator, a first optical coupler, and a second optical coupler. The optical resonator has a refractive index that depends on an electric field applied to the optical resonator. The first optical coupler is adjacent the optical resonator. The second optical coupler is adjacent the optical resonator.

A method for generating an oscillatory signal includes generating light, modulating the light into sideband optical signals, selecting a single sideband optical signal from the modulated light using a tunable filter, mixing the single sideband optical signal with the light, generating an electrical signal based on the mixed single sideband optical signal and light, amplifying the electrical signal, and controlling the modulation of the light using the amplified electrical signal.

Other aspects of the present invention will become readily apparent to those skilled in the art from the following detailed description, which shows and describes exemplary embodiments of the invention, simply by way of illustration of the best mode contemplated for carrying out the invention. The invention is capable of other and different embodiments, and its several details are capable of modifications in various respects, all without departing from the invention. Accordingly, the drawings and description are to be regarded as illustrative in nature, and not as restrictive.

BRIEF DESCRIPTION OF THE DRAWINGS

Various features, aspects, and advantages of the invention will be better understood with regard to the following description, appended claims, and accompanying drawings where:

DETAILED DESCRIPTION OF THE PREFERRED EMBODIMENTS

Optical resonators are electro-optical devices that are included in optical feedback loops to store energy having only specific resonant mode frequencies. Optical resonators are often small in size, having diameters on the order of millimeters, and may be used in many electro-optical system applications including tunable electro-optic filters. The optical resonators are curved optical waveguides, for example, a cylinder, a sphere, or a toroid within which light is internally reflected at the inner surface of the optical resonator.

Optical resonators can support resonator modes of light called whispering-gallery modes ("WGMs"), and thus, are often referred to as whispering-gallery mode resonators. WGMs occur when light having an evanescent wave component travels via internal reflection around the periphery of the optical resonator. The evanescent waves extend beyond the optical resonator's outer surface and may be coupled into an adjacent optical coupler as long as an optical coupler is located within the extent of the evanescent wave, typically on the order of the light's wavelength. Coupling losses between the optical coupler and the optical resonator are exponentially dependent upon the distance d between the surface of the optical coupler and the optical resonator ~ exp (−d/r*), where r* is the effective scale length of evanescent field of the resonator for the excited WGM as expressed in the following equation:

$$r^* = \lambda \big/ \sqrt{(4\Pi(n_{res}/n_{out})^2 - 1)}$$

where:
$\lambda$ is the wavelength of light evanescently coupled between the
optical coupler and the optical resonator;
$n_{res}$ is the index of refraction of the optical resonator; and
$n_{out}$ is the index of refraction outside the surface of the optical resonator.

Many optical resonators which propagate WGMs of light have extremely low transmission losses, and as a result, have a very high quality factor ("Q"). High-Q optical resonators are desirable because the higher the Q, the longer the amount of time the internally reflected light remains within the optical resonator and the greater the reduction of the spectral line width and phase noise. The ultimate intrinsic Q of the optical resonator ($Q_0$) is limited by the optical losses of the resonator material. Optical resonators having a radius of 10 to a few hundred micrometers have been produced with Q's in excess of $1 \times 10^9$ (see V. B. Braginsky, M. L. Gorodetsky, V. S. Ilchenko, Phys.Lett. A37, 393 (1989); L. Collot, V. Lefevre-Seguin, M. Brune, J. M. Raimond, S. Haroche, Europhys.Lett. 23, 327 (1993)). In particular, a Q in excess of $1 \times 10^{10}$ was demonstrated for optical resonators, and a Q of $10^{11}$ is expected for glass microsphere optical resonators with a resonant wavelength of light at 1550 nanometers, where the intrinsic loss of glass is a minimum.

Figure 1:
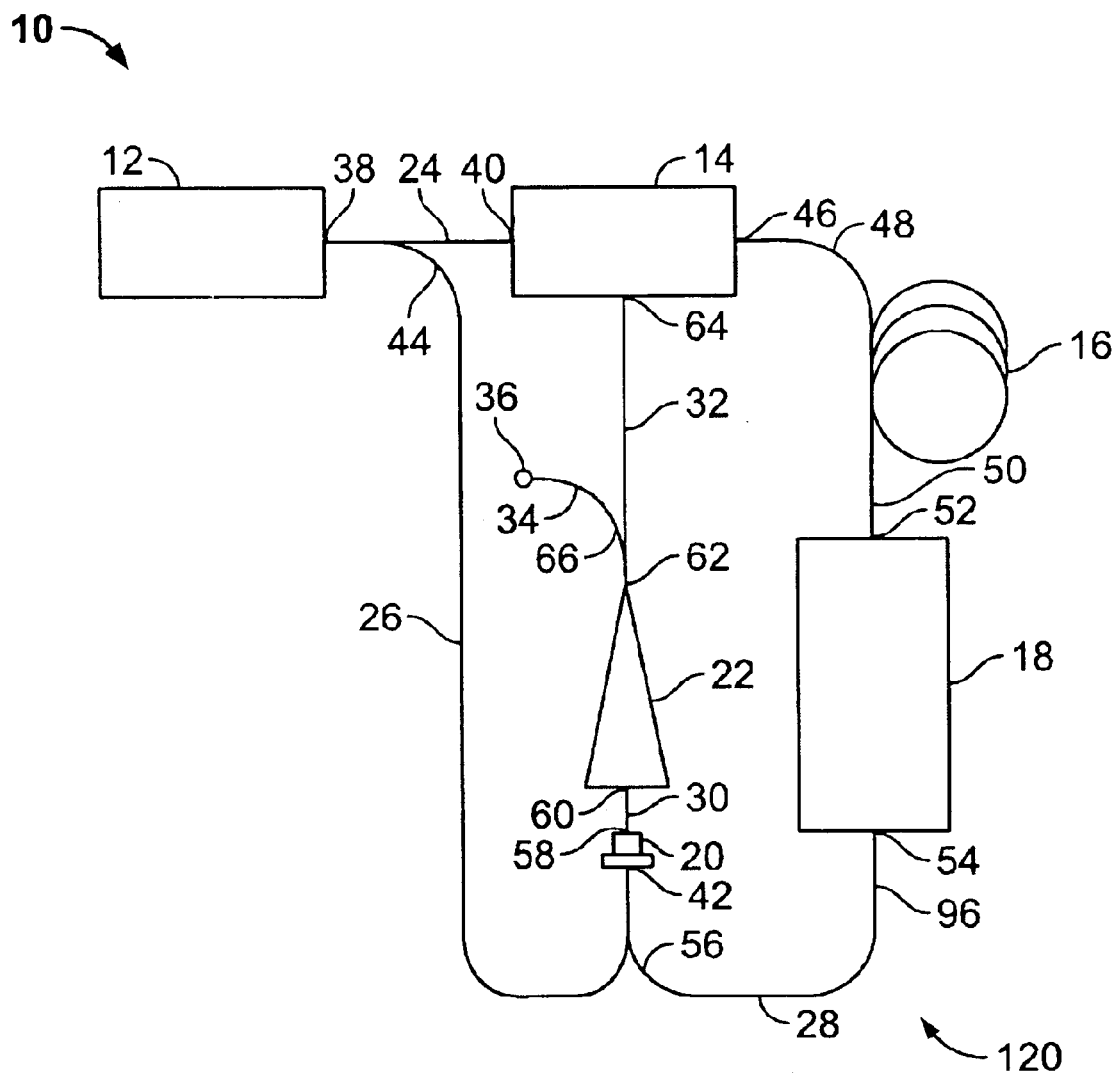
FIG. 1 is a diagram depicting an embodiment of the invention.

The present invention involves OEOs that include optical resonators. FIG. 1 is a diagram, not to scale, of one exemplary embodiment of an OEO 10 that includes a continuous-wave laser 12, electro-optic modulator 14, delay optical fiber 16, tunable electro-optic filter 18, photodetector 20, RF amplifier 22, first optical fiber 24, second optical fiber 26, third optical fiber 28, first coaxial cable 30, second coaxial cable 32, third coaxial cable 34, and output terminal 36.

In preferred embodiments, the laser 12 is FLD5F10NP made by Fujitsu located in San Jose, Calif. The electro-optic modulator 14 is integrated with the laser. In preferred embodiments the electro-optic modulator is an electro-absorption type electro-optic modulator in which phase modulation modulates light intensity. Other types of modulators known to those skilled in the art may be used, for example, an electro-absorption modulator, an acoustic-optic modulator, a polarization modulator, and a directional coupler modulator. The first, second, third, and delay optical fibers 24, 26, 28, and 16, respectively, are made from SMF-28 manufactured by Corning Incorporated of Corning, N.Y. The photodetector 20 is Lasertron QDMH2 made by Lasertron located in Burlington, Mass. The RF amplifier 22 is MSH-6312202-MOD made by Microwave Solutions located in National City, Calif. The first, second, and third coaxial cables 30, 32, and 34, respectively, are PE-34182-8 made by Pasternack Enterprises located in Irvine, Calif.

The laser 12 has an output 38 that is coupled to an optical input 40 of the electro-optic modulator 14 by the first optical fiber 24. Also, the output 38 of the laser is coupled to an input 42 of the photodetector 20 by the second optical fiber 26 that is coupled at one end 44 to the first optical fiber 24 adjacent the output 38 of the laser 12. The length of each of the first and second optical fibers 20 and 24 is approximately 50 centimeters. The electro-optic modulator 14 includes an output 46 that is coupled to one end 48 of the delay optical fiber 16. The other end 50 of the delay optical fiber 16 is coupled to an input 52 of the tunable electro-optic filter 18. The length of the delay optical fiber 16 is approximately one kilometer or greater. An output 54 of the tunable electro-optic filter 18 is coupled to the input 42 of the photodetector 20 by the third optical fiber 28 that is coupled at one end 56 to the second optical fiber 26 adjacent the input 42 of the photodetector 20. The length of the third optical fiber 28 is approximately 50 centimeters. An output 58 of the photodetector 20 is coupled to an input 60 of the RF amplifier 22 by the first coaxial cable 30 that is approximately 20 centimeters in length. An output 62 of the RF amplifier 22 is coupled to an electrical input 64 of the electro-optic modulator 14 by a second coaxial cable 32 that is approximately 20 centimeters in length, and to the output terminal 36 by a third coaxial cable 34 that is approximately 20 centimeters in length. The third coaxial cable 34 couples at one end 66 to the second coaxial cable 32 adjacent the output 62 of the RF amplifier 22.

Figure 2:
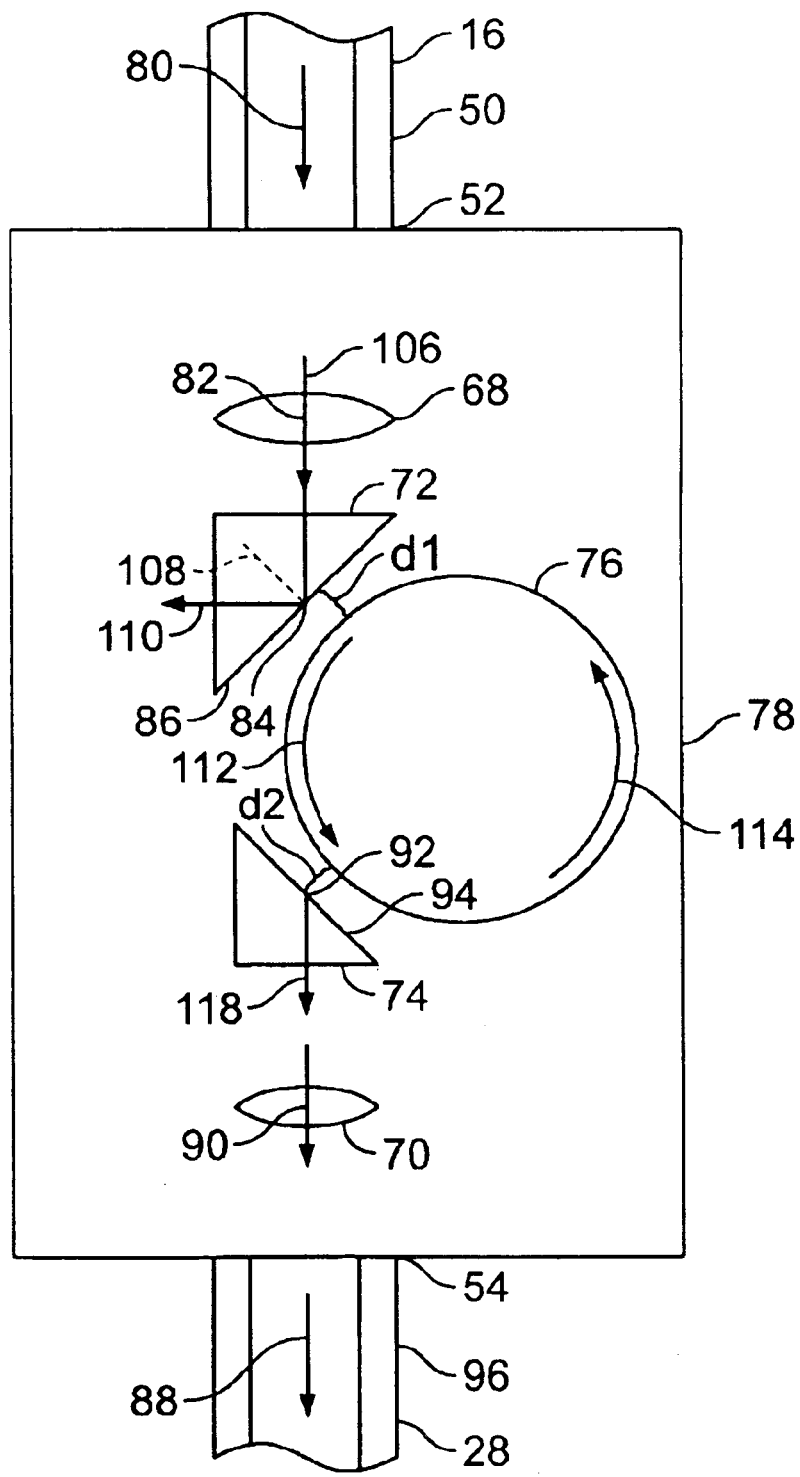
FIG. 2 is a cross-sectional diagram of an embodiment of the tunable electro-optic filter shown in FIG. 1.

FIG. 2 is a diagram, not to scale, depicting the tunable electro-optic filter 18 which includes a first lens 68, a second lens 70, a first optical coupler 72, a second optical coupler 74, and an optical resonator 76 which may be co-located on a single chip 78. Even though FIG. 2 depicts the first and second lenses as converging thin lenses, the first and second lenses can take on other forms, for example, gradient index lenses. In preferred embodiments, the first and second lenses are lens model 024-0690 made by Optosigma located in Santa Ana, Calif. The first and second optical couplers are both prism model 2A made by Drukker International located in Cuijk, Netherlands. The optical resonator is made of lithium niobate which is a material that allows for the propagation of light. However, the refractive index of the optical resonator is dependent upon electric fields established in the lithium niobate. The optical resonator is typically 3 to 6 millimeters in diameter, which corresponds from 16 to 8 GHz in frequency. The Q for the lithium niobate optical resonator is approximately $1 \times 10^7$.

One end 50 of the delay optical fiber 16 is coupled to the input 52 of the tunable electro-optic filter 18. The first lens 68 is positioned such that an optical axis of the delay optical fiber 16, indicated by the straight arrow 80, is aligned with a midpoint 82 of the first lens and a point 84 at an edge 86 of the first optical coupler 72 at which light is evanescently coupled into the optical resonator 76. Similarly, an optical axis of the third optical fiber 28, indicated by the straight arrow 88, that couples the output 54 of the tunable electro-optic filter to the photodetector 20 is aligned with both a midpoint 90 of the second lens 70 and a point 92 at the edge 94 of the second optical coupler 74 at which light is evanescently coupled out of the optical resonator.

The optical resonator 76 is positioned adjacent to both the point 84 at the edge 86 of the first optical coupler 72 where light is evanescently coupled into the optical resonator and the point 92 at the edge 94 of the second optical coupler 74 where light is evanescently coupled out from the optical resonator. The optical resonator is spaced away from the first optical coupler by a distance "d1" and the second optical coupler by a distance "d2" both of which typically are approximately 0.1 to 3 times the wavelength of the light.

In some embodiments, the midpoint 82 of the first lens 68 is positioned approximately two focal lengths of the first lens away from the one end 50 of the delay optical fiber 16, and the midpoint 82 of the first lens is positioned approximately two focal lengths of the first lens away from the point 84 at the edge 86 of the first optical coupler 72 that is closest to the optical resonator 76 where light is evanescently coupled into the optical resonator. Similarly, the midpoint 90 of the second lens 70 is positioned approximately two focal lengths of the second lens away from the point 92 at the edge 94 of the second optical coupler 74 where light is evanescently coupled out from the optical resonator. Also, an end 96 of the third optical fiber 28 that couples the tunable electro-optic filter 18 to the photodetector 20 is positioned approximately two focal lengths of the second lens away from the midpoint 90 of the second lens.

Figure 3:
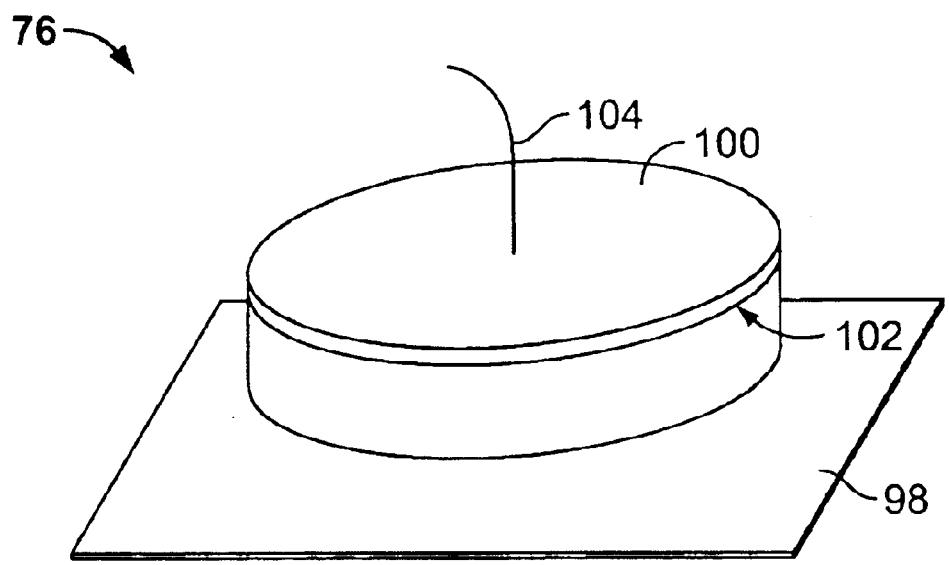
FIG. 3 is a perspective diagram of the optical resonator shown in FIG. 2.
Figure 4:
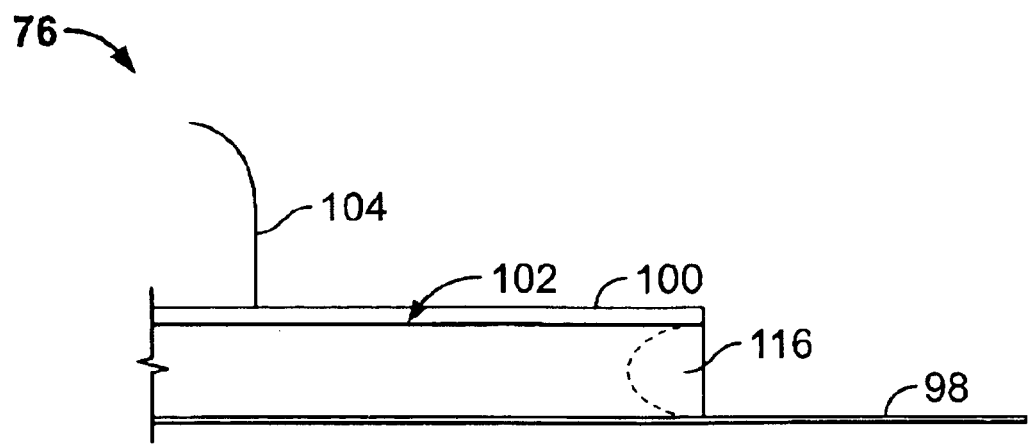
FIG. 4 is a partial cross-sectional diagram of the optical resonator shown in FIGS. 2 and 3.

Referring additionally to FIGS. 3 and 4, the optical resonator 76 is cylindrical and configured between a substrate 98 that functions as a ground electrode and a top electrode 100. The top electrode 100 may cover a top surface 102 of the optical resonator 76, as depicted in FIGS. 3 and 4, or may cover only a portion of the top surface (not shown). An interface wire 104 is coupled to the top electrode 100.

In operation, referring to FIG. 1, light having a single optical carrier frequency is generated by the laser 12 and travels through the output 38 of the laser 12 and into the first optical fiber 24. Light from the laser travels along the optical axis of the first optical fiber 24 and is input to the electro-optic modulator 14. Light output from the laser 12 is also propagated through the first optical fiber 24 and into the second optical fiber 26. The light travels along the optical axis of the second optical fiber 26 and is coupled into the input 42 of the photodetector 20.

The electro-optic modulator 14 modulates the light that travels through the electro-optic modulator 14 as a function of an electrical signal input to the electro-optic modulator 14 through the electrical input 64, as discussed in greater detail below. The modulated light, which includes the optical carrier frequency generated by the laser 12 and sideband frequencies, leaves the electro-optic modulator 14 through the output 46 of the electro-optic modulator 14 and is coupled into one end 48 of the delay optical fiber 16. The modulated light travels the long length of the delay optical fiber 16 along its optical axis indicated by the straight arrow 80, which provides for a long energy storage time and in turn decreases the phase noise associated with the modulated light. After traveling the length of the delay optical fiber 16, the modulated light is coupled into the tunable electro-optic filter 18 through the input 52 of the tunable electro-optic filter 18. Referring additionally to FIG. 2, light entering the tunable electro-optic filter 18 passes through the first lens 68 as indicated by straight arrow 106 and is focused by the first lens 68 on the point 84 at the edge 86 of the first optical coupler 72. The light is totally internally reflected relative to a perpendicular 108 to the edge 86 of the first optical coupler 72 at the point 84 at the edge 86 of the first optical coupler 72 where the light is evanescently coupled into the optical resonator 76 and propagates away from the edge 86 of the first optical coupler 72 as indicated by the straight arrow 110. An evanescent component of the totally reflected light extends away from the edge 86 of the first optical coupler 72 toward the optical resonator 76 where the light is coupled into the optical resonator 76. The light that is coupled into the optical resonator 76 travels around the outside edge of the optical resonator 76, as indicated by curved arrows 112 and 114 and establishes WGMs that extend beyond the surface of the optical resonator 76.

Referring additionally to FIGS. 3 and 4, an external electrical potential, typically between −100 volts and +100 volts depending upon the height of the optical resonator 76 is applied from an external voltage source (not shown) to the top electrode 100 via the interface wire 104 and produces an electrical field between the top electrode 100 and the substrate 98 which passes through the region 116 where light propagates in the optical resonator 76 near the outer edge of the optical resonator 76. The external electrical potential is used to change the refractive index of the lithium niobate optical resonator, and thus shift the frequency of the light propagating through the optical resonator 76. Thus, the tunable electro-optic filter 18 can be adjusted to select a single sideband from the modulated light output from the electro-optic modulator 14.

Evanescent components of the light traveling around the periphery of the optical resonator 76 are then coupled from the optical resonator 76 into the second optical coupler 74 at the point 92 at the edge 94 of the second optical coupler 74. The light coupled into the second optical coupler 74 from the optical resonator 76 travels toward the second lens 70 as indicated by the straight arrow 118. Next, the light travels through the second lens 70 that focuses the light on the output 54 of the tunable electro-optic filter 18 on one end 96 of the third optical fiber 28. The light then travels through the third optical fiber 28 along the optical axis of the third optical fiber 28, indicated by straight arrow 88, and into the second optical fiber 26 that couples the light into the input 42 of the photodetector 20 along with the light from the laser 12 that traveled through the second optical fiber 26. Thus, the sideband frequency selected using the tunable electro-optic filter 18 is then recombined and mixed with the optical carrier at the input 42 of the photodetector 20.

The photodetector 20 generates an electrical signal that quantifies the intensity of the light mixed at the input 42 of the photodetector 20. The electrical signal generated by the photodetector 20 is output 58 through the output 58 of the photodetector 20 through the first coaxial cable 30 and into the input 60 of the RF amplifier 22. The amplification provided by the RF amplifier 22 is selected such that the total open-loop gain for the electro-optic feedback loop 120, that includes the delay optical fiber 16, tunable electro-optic filter 18, third optical fiber 28, photodetector 20, first coaxial cable 30, RF amplifier 22, and second coaxial cable 32, is greater than one. Thus, the gain provided by the RF amplifier 22 is sufficient to drive the OEO 10 into self-sustained oscillation. The RF amplifier 22 amplifies the input electrical signal by approximately +30 dB to +50 dB and then outputs an amplified electrical signal that travels through the second coaxial cable 32 to the electrical input 64 of the electro-optic modulator 14 and through the third coaxial cable 34 to the output terminal 36. The amplified electrical signal input to the electro-optic modulator 14, as discussed above, modulates the intensity of the light from the laser 12. The amplified electrical signal provided at the output terminal 36 is a microwave signal that oscillates at the sideband frequency selected by the tunable electro-optic filter 18.

Figure 5:
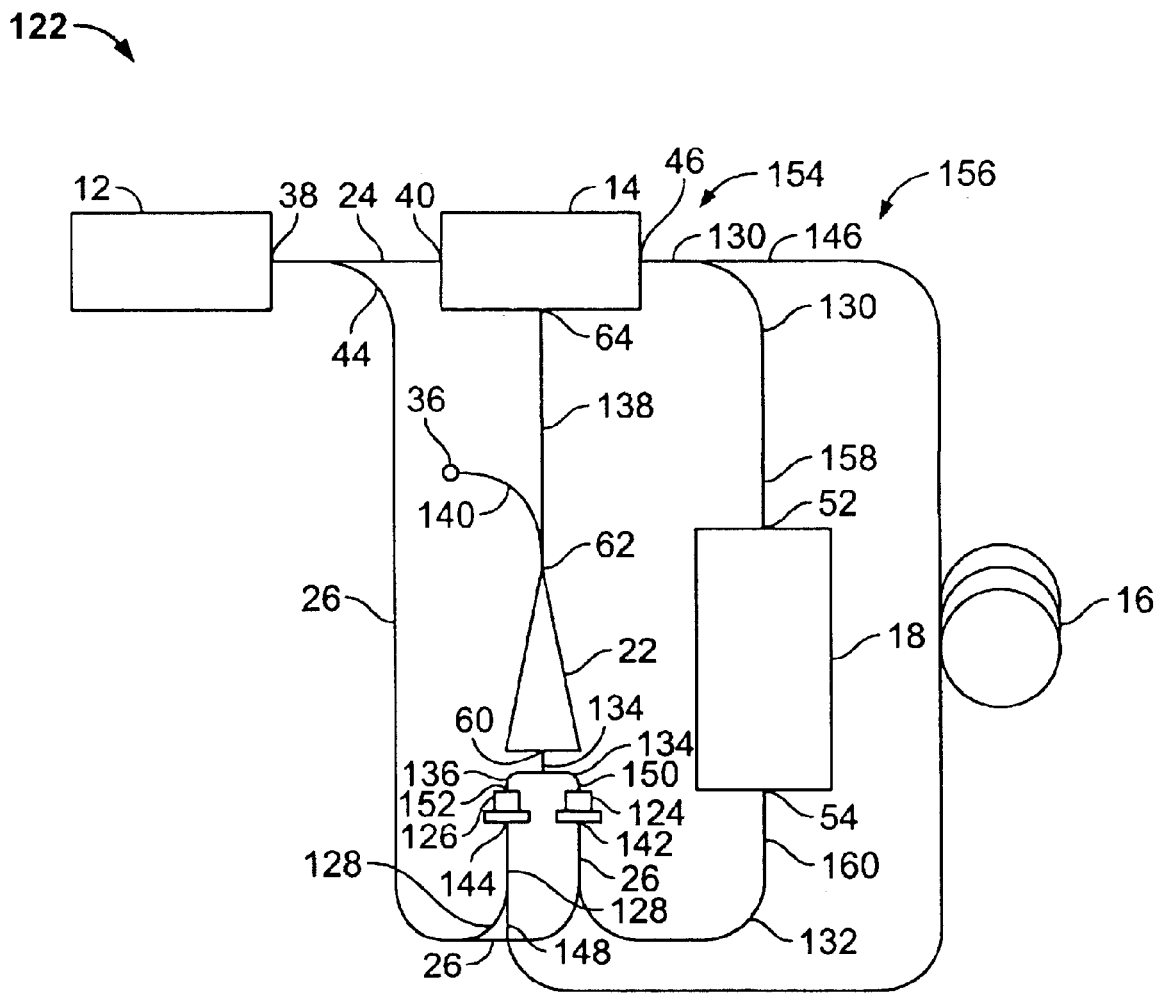
FIG. 5 is a diagram depicting another embodiment of the invention.

FIG. 5 is a diagram, not to scale, depicting another OEO embodiment 122 that includes a laser 12, electro-optic modulator 14, delay optical fiber 16, tunable electro-optic filter 18, first photodetector 124, second photodetector 126, RF amplifier 22, first optical fiber 24, second optical fiber 26, third optical fiber 128 (optional), fourth optical fiber 130, fifth optical fiber 132, first coaxial cable 134, second coaxial cable 136, third coaxial cable 138, fourth coaxial cable 140, and output terminal 36.

In preferred embodiments, the laser 12, electro-optic modulator 14, tunable electro-optic filter 18, and RF amplifier 22 are the same devices used in the embodiment of FIG. 1. FIG. 5's first and second photodetectors 124 and 126, respectively, are the same photodetectors as the photodetector 20 in FIG. 1's embodiment. Also, the first, second, third, fourth, fifth and delay optical fibers 24, 26, 128, 130, and 132, respectively, in the FIG. 5's embodiment are made from the same fiber optic material as that used for the first, second, third, and delay optical fibers 24, 26, and 28, respectively, of the FIG. 1 embodiment. In addition, the first, second, third, and fourth coaxial cables 134, 136, 138, and 140, respectively, in FIG. 5 are made from the same coaxial cable used for the first, second, and third coaxial cables 30, 32, and 34, respectively, in the embodiment of FIG. 1.

Referring to FIG. 5, the output 38 of the laser 12 is coupled to an optical input 40 of the electro-optic modulator 14 by the first optical fiber 24. Also, the output 28 of the laser 12 is coupled to an input 142 of the first photodetector 124 by the second optical fiber 26. The second optical fiber 26 is coupled to the first optical fiber 24 adjacent the output port 38 of the laser 12. The optional third optical fiber 128 couples between the input 144 of the second photodetector 126 and the second optical fiber 26. The length of each of the first, second, and third optical fibers 24 and 26 is approximately 50 centimeters. The electro-optic modulator 14 includes an optical output 46 that is coupled to the input 52 of the tunable electro-optic filter 18 by the fourth optical fiber 130. The length of the fourth optical fiber 130 is approximately 50 centimeters. The output 54 of the tunable electro-optic filter 18 is coupled to the input 142 of the first photodetector 124 by the fifth optical fiber 132 that is approximately 50 centimeters in length. The fifth optical fiber 133 is coupled to the second optical fiber 26 adjacent the input 142 of the first photodetector 124. One end 146 of the delay optical fiber 16 is coupled to the fourth optical fiber 130 between the electro-optic modulator 14 and the tunable electro-optic filter 18. The other end 148 of the delay optical fiber 16 is coupled to the third optical fiber 128 adjacent to the input 144 of the second photodetector 126. The length of the delay optical fiber 16 is approximately 2000 meters to 4000 meters.

The output 150 of the first photodetector 124 is coupled by the first coaxial cable 134 to the input 60 of the RF amplifier 22. The output 152 of the second photodetector 126 is also coupled to input 60 of the RF amplifier 22 by the second coaxial cable 136 that couples to the first coaxial cable 134 adjacent to the input 60 of the RF amplifier 22. The length of each of the first and second coaxial cables 134 and 136 is approximately 20 centimeters. The output 62 of the RF amplifier 22 is coupled to the electrical input 64 of the electro-optic modulator 18 by the optional third coaxial cable 138. The output 62 of the RF amplifier 22 is also coupled to the output terminal 36 by a fourth coaxial cable 140 that couples to the optional third coaxial cable 138 adjacent the output 62 of the RF amplifier 22. The length of each of the third and fourth coaxial cables 138 and 140 is approximately 20 centimeters.

Therefore, the embodiment depicted in FIG. 5 is a dual-loop OEO 122 where one loop 154 includes the electro-optic modulator 14, fourth optical fiber 130, tunable electro-optic filter 18, fifth optical fiber 132, a portion of the second optical fiber 26, first photodetector 124, first coaxial cable 134, RF amplifier 22, and third coaxial cable 138. The other loop 156 includes the electro-optic modulator 14, a portion of the fourth optical fiber 130, delay optical fiber 16, a portion of the optional third optical fiber 128, second photodetector 126, second coaxial cable 136, a portion of the first coaxial cable 134, RF amplifier 22, and third coaxial cable 130.

Referring additionally to FIGS. 2, 3, and 4, the tunable electro-optic filter 18 in the embodiment of FIG. 5 is similar to that of the embodiment of FIG. 1, however, the input 52 of the tunable electro-optic filter 18 is coupled to one end 158 of the third optical fiber 130 in FIG. 5 instead of the one end 50 of the delay optical fiber 16 as shown in FIG. 1. Also, the output 54 of the tunable electro-optic filter 18 is coupled to one end 160 of the fourth optical fiber 132 in FIG. 5 instead of one end 96 of the third optical fiber 28 in FIG. 1.

The operation of the embodiment of FIG. 5 is similar to that of the embodiment depicted in FIG. 1, however, there are the following differences. The modulated light output from the electro-optic modulator 14 propagates through the fourth optical fiber 130 to the input 52 of the tunable electro-optic filter 18. The light output from the tunable electro-optic filter 18 propagates through the fifth optical fiber 132 and is coupled into the second optical fiber 26, which in turn couples both the light output from the tunable electro-optic filter 18 and light from the laser 12 into the first photodetector 124. The modulated light from the electro-optic modulator 14 is also coupled from the fourth optical fiber 130 into one end 146 of the delay optical fiber 16, through the delay optical fiber 16, and into a portion of the optional third optical fiber 128, which in turn couples both the modulated light that travels through the delay optical fiber 16 and light from the laser 12 into the input 144 of the second photodetector 126.

The first photodetector 124 generates a first electrical signal by mixing the light from the laser 12 and light from the tunable electro-optic filter 18. The second photodetector 126 generates a second electrical signal by mixing the light from the laser 12, when the third optical fiber 128 is included, and modulated light from the delay optical fiber 16. The first electrical signal is output from the first photodetector 124 and input to the input 60 of the RF amplifier 22 via the first coaxial cable 134. The second electrical signal is output from the second photodetector 126 and input to the input 60 of the RF amplifier 22's input via the second and first coaxial cables 136 and 134, respectively. The RF amplifier 22 amplifies the first and second electrical signals by approximately +30 dB to +50 dB, which is sufficient to drive the OEO 122 into self-sustained oscillation, and then outputs an amplified electrical signal that travels through the third coaxial cable 138 to the electrical input 64 of the electro-optic modulator 14. The amplified electrical signal also travels through the fourth coaxial cable 140 to the output terminal 36. The amplified electrical signal input to the electro-optic modulator 14, as discussed above, modulates the intensity of the light from the laser 12. The amplified electrical signal provided at the output terminal 36 is a microwave signal that oscillates at the sideband frequency selected by the tunable electro-optic filter 18.

Advantageously, the optical resonator 76 in the tunable electro-optic filter 18 of both the FIG. 1 embodiment and the FIG. 5 embodiment has a high Q that allows for narrow filtering of a selected sideband frequency sustained by the OEO 10 and 122. Because the optical resonator 76 provides for high-Q frequency selection, the optical resonator 76 also provides for frequency stabilization and broadband suppression of noise generated by the other components of the OEO. In addition, the embodiments depicted in FIGS. 1, 2, 3, 4, and 5 are advantageous in that they provide for a high-Q tunable electro-optic filter 18 that can be tuned by an external electrical potential, and as such, may be tuned in a short amount of time. Also, the tunable electro-optic filter 18 need only be tuned over a very limited fraction of its full optical bandwidth in comparison with typical RF bandpass filters which may be tuned across their entire bandwidth. Therefore, only a small variation in the external electrical potential applied to the top electrode 100 of the optical resonator 76 is needed to provide a wide range of filtering in the microwave domain. Also, the tunable electro-optic filter 18 depicted in FIGS. 2, 3, and 4 and discussed above can be configured within one chip 78, thus reducing costs by reducing the total number of components to be configured during manufacturing of the OEO.

Although exemplary embodiments of the present invention have been described, they should not be construed to limit the scope of the appended claims. Those skilled in the art will understand that various modifications may be made to the described embodiments. For example, the optical resonator 76 may be spherical-shaped, cylindrical-shaped, torodial-shaped, or may have other physical configurations. In addition, even though FIG. 2 only depicts an embodiment of the tunable electro-optic filter 18 where the optical resonator 76 is physically separated from the first and second optical couplers 72 and 74, respectively, by free space, the distance between the optical resonator 76 and first and second optical couplers 72 and 74 may be maintained by a spacer (not shown) comprised of a thin film of material, for example, FIBERCOAT QLI manufactured a Navitar Coating Labs located in Newport Beach, Calif. One side of the spacer would contact the optical resonator 76 while the opposing side of the spacer would couple to either the first or second optical coupler.

Moreover, to those skilled in the various arts, the invention itself herein will suggest solutions to other tasks and adaptations for other applications. The present embodiments must therefore be considered in all respects as illustrative and not restrictive. The scope of the invention is not limited to those embodiments, but must be determined instead by the appended claims, along with the full scope of equivalents to which those claims are legally entitled.

What is claimed is:

1. An opto-electronic oscillator comprising:
   a modulator to modulate light in response to a modulation control signal and to output modulated light;
   a tunable optical filter to receive at least one portion of the modulated light output from the modulator and to spectrally filter the received portion of the modulated light to produce a filtered optical signal;
   a photodetector to receive and convert the filtered optical signal into a detector signal; and
   a feedback section to receive the detector signal and to produce the modulation control signal to the modulator.

2. The opto-electronic oscillator according to claim 1, wherein the tunable optical filter includes:
   an optical resonator having a refractive index that depends on an electric field applied to the optical resonator;
   a first optical coupler adjacent the optical resonator; and
   a second optical coupler adjacent the optical resonator.

3. The opto-electronic oscillator according to claim 2, wherein the tunable filter further comprises a first lens adjacent to the first optical coupler.

4. The opto-electronic oscillator according to claim 3, wherein the tunable filter further comprises a second lens adjacent to the second optical resonator.

5. The opto-electronic oscillator according to claim 4, wherein the first lens and the second lens both are gradient index lenses.

6. The opto-electronic oscillator according to claim 4, wherein the optical resonator, first optical coupler, second optical coupler, first lens, and second lens are co-located within one chip.

7. The opto-electronic oscillator according to claim 2, wherein the first optical coupler and the second optical coupler both are prisms.

8. The opto-electronic oscillator according to claim 2, wherein the optical resonator is made from lithium niobate.

9. The opto-electronic oscillator according to claim 2, wherein the optical resonator has a shape selected from the group consisting of cylindrical, spherical, and toroidal.

10. The opto-electronic oscillator according to claim 2, wherein the optical resonator is located between a first electrode and a second electrode.

11. The opto-electronic oscillator according to claim 10, wherein the refractive index of the optical resonator changes according to variation in an electrical potential applied to the first electrode.

12. The opto-electronic oscillator according to claim 2, wherein the tunable filter further comprises:
    a first spacer having one surface coupled to the first optical coupler and another surface in contact with the optical resonator; and
    a second spacer having one surface coupled to the second optical coupler and another surface in contact with the optical resonator.

13. The opto-electronic oscillator according to claim 1, further comprising a delay optical fiber coupled between the modulator and the tunable optical filter.

14. The opto-electronic oscillator according to claim 1, further comprising an optical delay element optically coupled to in an optical path between the modulator and the photodetector to cause a delay and suppress phase noise in light received by the photodetector.

15. The opto-electronic oscillator according to claim 1, wherein the feedback section comprises an amplifier coupled between the photodetector and the modulator.

16. The opto-electronic oscillator according to claim 1, further comprising a laser coupled to the modulator.

17. The opto-electronic oscillator according to claim 16, wherein the photodetector is coupled to further receive a portion of laser light from the laser prior to modulation by the modulator and to mix the portion of laser light from the laser and the filtered optical signal from the tunable filter.

18. The opto-electronic oscillator according to claim 1, further comprising a delay optical fiber having opposing ends wherein the modulator is coupled to both the tunable filter which receives the one portion of the modulated light output from the modulator and one end of the delay optical fiber which receives a second portion of the modulated light output from the modulator, and a second photodetector coupled to receive the second portion of the modulated light from the delay optical fiber and to produce a second detector signal,
    wherein the feedback section receives and combines the detector signal and the second detector signal to produce the modulation control signal to the modulator.

19. The opto-electronic oscillator according to claim 18, wherein the tunable optical filter comprises a tunable electro-optic resonator which has a structure to support optical whispering gallery modes.

20. The opto-electronic oscillator according to claim 19, wherein the electro-optic resonator comprises lithium niobate.

21. The opto-electronic oscillator according to claim 18, further comprising a laser operable to produce continuous-wave light to the modulator for producing the modulated light, wherein the photodetector is coupled to receive a portion of the continuous-wave light to mix with the filtered optical signal in producing the detector signal.

22. The opto-electronic oscillator according to claim 21, wherein the second photodetector is also coupled to receive another portion of the continuous-wave light from the laser and to mix with the second portion of the modulated light from the delay optical fiber in producing the second detector signal.

23. The opto-electronic oscillator according to claim 22, wherein the feedback section comprises an amplifier coupled between the modulator and both the photodetector and the second photodetector.

24. The opto-electronic oscillator according to claim 1, wherein the tunable optical filter comprises an optical resonator having a refractive index that changes in response to an applied electric field and having a structure to support optical whispering gallery modes.

25. The opto-electronic oscillator according to claim 24, wherein the optical resonator comprises a curved optical waveguide.

26. The opto-electronic oscillator according to claim 24, wherein the optical resonator is a cylinder.

27. The opto-electronic oscillator according to claim 24, wherein the optical resonator is a sphere.

28. The opto-electronic oscillator according to claim 24, wherein the optical resonator is a toroid.

29. A method for generating an oscillatory signal, the method comprising:
  generating light;
  modulating the light into sideband optical signals;
  selecting a single sideband optical signal from the modulated light using a tunable filter;
  mixing the single sideband optical signal with the light;
  generating an electrical signal based on the mixed single sideband optical signal and light;
  amplifying the electrical signal; and
  controlling the modulation of the light using the amplified electrical signal.

30. The method according to claim 29, further comprising outputting the amplified electrical signal.

31. The method according to claim 29, further comprising propagating the modulated light through a delay optical fiber after modulating the light into sideband optical signals and before selecting the single sideband optical signal.

32. The method according to claim 29, further comprising propagating modulated light through a delay optical fiber configured in parallel with the tunable filter.

33. The method according to claim 32, further comprising:
  mixing the modulated light propagated through the delay optical fiber with the light;
  generating another electrical signal based on the mixed modulated light that propagated through the delay optical fiber and the light;
  amplifying the another electrical signal in addition to the electrical signal; and
  controlling the modulation of the light using the amplified electrical signal and the amplified another electrical signal.

34. The method according to claim 29, wherein selecting a single sideband optical signal from the modulated light using a tunable filter includes:
  propagating the modulated light through a first lens;
  propagating the modulated light through a first optical coupler; coupling an evanescent component of the modulated light from the first optical coupler into an optical resonator;
  coupling an evanescent component of modulated light from the optical resonator into a second optical coupler; and
  propagating the modulated light coupled from the second optical coupler through a second lens.

35. The method according to claim 34, wherein selecting a single sideband optical signal from the modulated light using a tunable filter further includes setting the refractive index of the optical resonator using an electric field created by applying an external potential to an electrode on one side of the optical resonator.

36. An opto-electronic oscillator, comprising:
  an optical modulator having an input optical port to receive input continuous-wave light, a control port to receive a modulation control signal, and an output optical port to export modulated light, wherein the optical modulator modulates the input continuous-wave light in response to the modulation control signal; and
  an active feedback loop having an input end coupled to the output optical port of the optical modulator to receive at least a portion of the modulated light and an output end coupled to the control port to supply the modulation control signal, wherein the active feedback loop comprises:
  a tunable optical resonator to filter the received portion of the modulated light;
  a photodetector to mix light after being filtered by the tunable optical resonator and a portion of the input continuous-wave light to produce a detector output; and
  an amplifier to amplify the detector output to produce the modulation control signal.

37. The opto-electronic oscillator according to claim 36, the active feedback loop further comprises an optical delay to cause a delay in light received by the photodetector.

38. The opto-electronic oscillator according to claim 37, wherein the optical delay comprises a delay optical fiber.

39. The opto-electronic oscillator according to claim 36, wherein the tunable optical resonator has a refractive index that depends on an applied electric field and a structure to support optical whispering gallery modes.

40. The opto-electronic oscillator according to claim 36, further comprising:
  an optical delay coupled to receive another portion of the modulated light from the optical modulator; and
  a second photodetector to receive light from the optical delay to produce a second detector output;
  wherein the amplifier is coupled to receive a mixture of the detector output and the second detector output and to amplify the mixture to produce the modulation control signal.

41. The opto-electronic oscillator according to claim 40, wherein the optical delay comprises a delay optical fiber.

42. The opto-electronic oscillator according to claim 40, wherein the second photodetector is also coupled to receive a portion of the input continuous-wave light and to produce the second detector output from conversion of a mixture of the received portion of the input continuous-wave light and the light from the optical delay.

* * * * *